(12) United States Patent
Tu

(10) Patent No.: US 6,200,898 B1
(45) Date of Patent: Mar. 13, 2001

(54) GLOBAL PLANARIZATION PROCESS FOR HIGH STEP DRAM DEVICES VIA USE OF HF VAPOR ETCHING

(75) Inventor: Kuo-Chi Tu, Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/425,907

(22) Filed: Oct. 25, 1999

(51) Int. Cl.$^7$ ...................................................... H01L 21/00
(52) U.S. Cl. ........................... 438/692; 438/672; 438/706; 438/723; 438/724; 438/734
(58) Field of Search .................................. 438/633, 637, 438/672, 692, 706, 723, 724, 734, 743, 744; 216/38, 67, 79

(56) References Cited

U.S. PATENT DOCUMENTS

| | | | |
|---|---|---|---|
| 5,376,233 | 12/1994 | Man | ...................................... 156/662 |
| 5,876,879 | 3/1999 | Kleinhenz et al. | ..................... 430/50 |
| 6,074,955 | * 6/2000 | Lin et al. | .......................... 438/719 X |
| 6,136,661 | * 10/2000 | Yen et al. | ......................... 438/719 X |
| 6,136,716 | * 10/2000 | Tu | .................................... 438/719 X |

* cited by examiner

*Primary Examiner*—William Powell
(74) *Attorney, Agent, or Firm*—George O. Saile; Stephen B. Ackerman

(57) ABSTRACT

A process to obtain a level top surface topography, for a semiconductor chip comprised with high step height, DRAM crown shaped capacitor structures, as well as comprised with lower step height, peripheral logic devices, has been developed. The process features the use of selective vapor HF procedures, removing insulator layers only from regions located between individual DRAM crown shaped storage node structures. The polysilicon layer, used for the upper plate structure, fills the space between individual crown shaped storage node structures, allowing a level top surface topography for the semiconductor chip to be realized, featuring an upper plate structure, as the top surface of the DRAM region, while the peripheral, logic device region, at the same level as the top of the DRAM crown shaped capacitor structures, is encased in insulator layers.

21 Claims, 5 Drawing Sheets

GLOBAL PLANARIZATION PROCESS FOR HIGH STEP DRAM DEVICES VIA USE OF HF VAPOR ETCHING

BACKGROUND OF THE INVENTION (1) Field of the Invention

The present invention relates to methods used to fabricate semiconductor devices, and more specifically to a method used to achieve global planarization for integrated circuits comprised with dynamic random access memory, (DRAM), devices, and with logic devices.

(2) Description of Prior Art

Integration of memory devices, such as DRAM devices, with logic devices, on the same semiconductor chip, have resulted in enhanced performance, as well as cost reductions, for the specific semiconductor chip formed with both type devices, when compared to counterpart combinations of semiconductor chips, each comprised with either only memory or only logic devices. In addition, the performance of DRAM devices has been enhanced via the use of crown shaped capacitor structures, resulting in increased capacitor surface area, thus supplying increased capacitance and signal. However the high step height of the DRAM, crown shaped capacitor, located in a memory cell array, adjacent to peripheral regions comprised with lower step height, logic devices, can lead to difficulties when attempting to globally cover these devices with insulator.

This invention will describe a novel procedure for obtaining global planarization for semiconductor chips comprised with both type devices, resulting in a smooth top surface topography for passivating insulator layers which overlay both DRAM devices, comprised with crown shaped capacitor structures, and logic devices, comprised with metal interconnect structures, less demanding in step height than the crown shaped capacitor structures, of the DRAM devices. This is accomplished using a series of selective HF vapor etch procedures. After formation of the crown shaped storage node structures, in storage node openings formed in a thick borophosphosilicate glass, (BPSG), layer, a thin, chemically vapor deposited, silicon oxide layer, formed using tetraethylorthosilicate, (TEOS), as a source, is used to cover the crown shaped storage node structures, as well as covering all regions of the top surface of the BPSG layer, including the region between crown capacitor shapes. A photoresist shape is formed overlying non-crown shaped structures, followed by a first HF vapor etch procedure, selectively removing the TEOS formed, silicon oxide layer from the crown capacitor shapes, as well as from the BPSG layer, located between the crown shaped structures. A second HF vapor etch is then used to remove the BPSG layer from between crown shaped structures, using either the photoresist shape as a mask, or removing the photoresist shape, and using the thin TEOS formed, silicon oxide layer, as an etch mask. The use of the TEOS formed silicon oxide layer, and the selective HF vapor etch, do not rely on the photoresist shape, which can be damaged during a conventional wet etch, BPSG removal procedure, to protect insulator layers overlying non-DRAM regions. Subsequent formation of polysilicon upper plate structures, fill the space between the crown shaped structures, resulting in a smooth top surface topography for a semiconductor device, comprised with high step height, DRAM devices, and with less severe step height, logic devices.

Prior art, such as Kleinhenz et al, in US. Pat. No. 5,876,879, as well as Man, in U.S. Pat. No. 5,376,233, describe methods of selectively etching insulator layers, using HF vapor etching. These prior arts however, do not describe the novel series of procedures, photoresist masking, TEOS formed silicon oxide masking, and the selective HF vapor etch, used in this invention, to obtain global planarization for semiconductor chips comprised with varying step height structures.

SUMMARY OF THE INVENTION

It is an object of this invention to provide a smooth top surface topography for a semiconductor chip comprised with DRAM devices, featuring high step height features, such as crown shaped capacitor structures, and comprised of logic devices, in peripheral regions of the semiconductor chip.

It is another object of this invention to protect insulator layers located overlying peripheral regions of the semiconductor chip, from procedures used to remove insulator material from between DRAM crown shaped structures, via use of photoresist masking shapes, and via the use of a thin silicon oxide layer, formed using TEOS as a source.

It as yet another object of this invention to use a first HF vapor etching procedure, to selectively remove the TEOS deposited, silicon oxide layer, from an underlying borophosphosilicate glass, (BPSG), layer, using a photoresist shape as a mask, and to use a second HF vapor etching procedure, to selectively etch a region of the BPSG layer, using the photoresist shape, or the TEOS deposited silicon oxide layer, as a mask.

In accordance with the present invention a method of achieving global planarization for a semiconductor chip, comprised with DRAM cell arrays, and peripheral logic devices, featuring the use of TEOS deposited silicon oxide masking, and selective HF vapor etching procedures, is described. After forming openings in a BPSG layer, polysilicon crown shaped storage node shapes are formed in these openings, overlying and contacting, conductive plug structures, which in turn are used to communicate with underlying source/drain regions, of a transfer gate transistor. A thin, TEOS deposited, silicon oxide layer, is then formed overlying the BPSG layer, and covering the polysilicon crown shape storage node structures. A photoresist shape is used as a mask to protect the thin, TEOS formed, silicon oxide layer, overlying peripheral logic device regions, during a first, selective HF vapor etch procedure, used to remove the thin, TEOS formed, silicon oxide layer, from the top surface of the BPSG layer, located between polysilicon crown shaped storage node structures, as well as removing the thin, TEOS layer from the surface of the polysilicon crown shaped storage node structures. The photoresist shape, can remain, or be removed, prior to a second, selective HF vapor procedure, used to selectively remove unprotected regions of the BPSG layer, in an area between polysilicon crown shaped storage node structures, with the photoresist shape, or the thin, TEOS layer, providing the desired masking needs. After formation of a capacitor dielectric layer, on the exposed surfaces of the polysilicon crown shaped capacitor structures, a polysilicon layer is deposited, filling the space between the polysilicon crown shaped capacitor structures. A patterning procedure, used to define a polysilicon upper plate structure, completes the fabrication procedure of the crown shaped capacitor structure, encased with the BPSG layer, resulting in a semiconductor chip exhibiting a top surface topography, featuring a top surface of the crown shaped capacitor structures, at the same level as a top surface of the BPSG layer, located overlying peripheral logic device regions.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
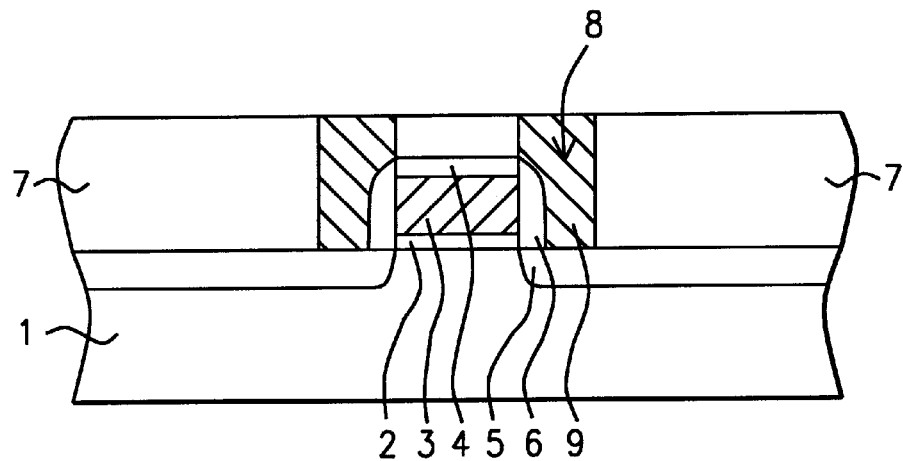
FIGS. 1–9, which schematically, in cross-sectional style, show key stages of fabrication used to achieve global planarization for a semiconductor chip, comprised with DRAM devices, featuring high step heights crown shaped capacitor structures, and comprised with peripheral, logic devices, featuring a less severe topology than the DRAM device counterparts.

The methods used to create global planarization for a semiconductor chip, comprised with DRAM devices, featuring severe topography as a result of crown shaped capacitor structures, and comprised with peripheral, logic devices, featuring less severe topography, will now be described in detail. A semiconductor substrate 1, comprised of single crystalline silicon, with a <100> crystallographic orientation, is sued and schematically shown in FIG. 1. Gate insulator layer 2, comprised of silicon dioxide, at a thickness between about 30 to 300 Angstroms, is obtained via thermal oxidation procedures. Polysilicon layer 3, is deposited via low pressure chemical vapor deposition, (LPCVD), procedures, to a thickness between about 500 to 4000 Angstroms. Polysilicon layer 3, is either doped in situ, during deposition, via the addition of arsine, or phosphine, to a silane ambient, or polysilicon layer 3, is deposited intrinsically, then doped via ion implantation of arsenic or phosphorous ions. A silicon nitride layer 4, obtained via LPCVD or plasma enhanced chemical vapor deposition, (PECVD), procedures, at a thickness between about 500 to 3000 Angstroms, is used to cap polysilicon layer 3. Conventional photolithographic and reactive ion etching, (RIE), procedures, are used to create the silicon nitride capped, polysilicon gate structure, or word line. If a more conductive word line is desired, a polycide, (metal silicide-polysilicon), layer, can be used in place of polysilicon layer 3. Source/drain regions 5, are next formed, via ion implantation of arsenic or phosphorous ions, in regions of semiconductor substrate 1, not covered by the gate structures. Insulator spacers 6, comprised of silicon nitride, are next formed via deposition of a silicon nitride layer, via LPCVD or PECVD procedures, at a thickness between about 200 to 1000 Angstroms, followed by an anisotropic RIE procedure, using $CHF_3$ as an etchant. The results of these procedures are schematically shown in FIG. 1.

A first borophosphsilicate glass, (BPSG), layer 7, is deposited, via LPCVD or PECVD procedures, at a thickness between about 8000 to 12000 Angstroms, comprised with between about 15 to 20 weight % $B_2O_3$, and with between about 5 to 10 weight % $P_2O_5$. A chemical mechanical polishing, (CMP), procedure is employed to create a smooth top surface topography for first BPSG layer 7. Conventional photolithographic and RIE procedures, using CHF3 as an etchant, are used to open first contact holes 8, in first BPDG layer 7, exposing portion of the top surface of source/drain regions 5. After removal of the photoresist shape, used to define first contact holes 8, via plasma oxygen ashing and careful wet cleans, first contact plug structures 9, shown schematically in FIG. 1, are formed in first contact holes 8. First contact plug structures 9, are formed via deposition of either an in situ doped polysilicon layer, or a tungsten layer, via LPCVD procedures, to a thickness between about 3000 to 8000 Angstroms, completely filling first contact holes 8. A CMP, or a selective RIE procedure, using $Cl_2$ as an etchant, is used to remove material from the top surface of first BPSG layer 7, creating first contact plug structures 9, in first contact holes 8.

Figure 2:
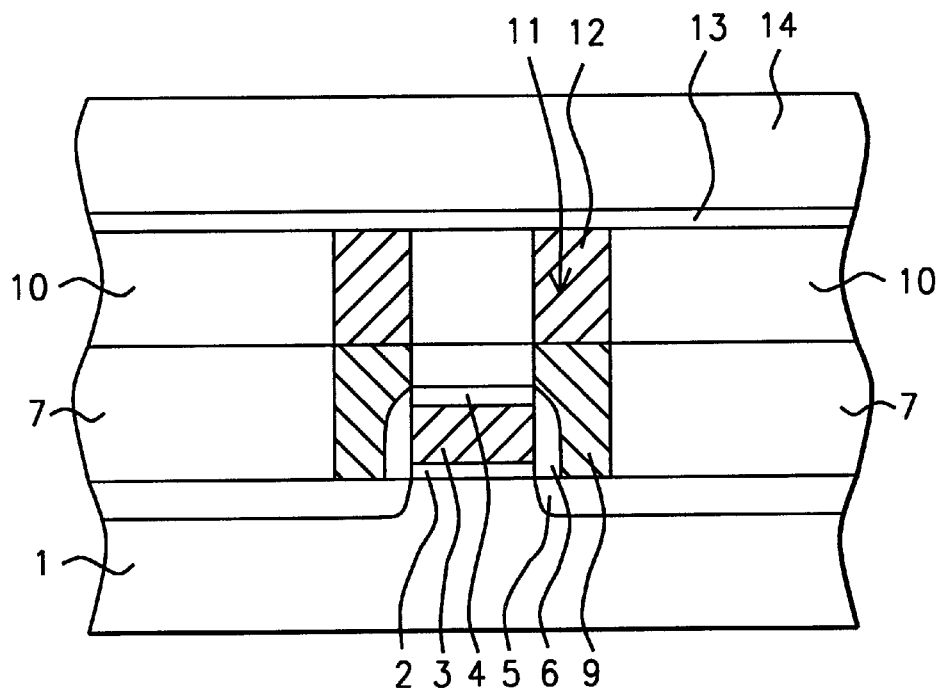

A second BPSG layer 10, is next deposited via LPCVD or PECVD procedures, to a thickness between about 8000 to 12000 Angstroms, comprised with between about 15 to 25 weight % $B_2O_3$, and between about 5 to 10 weight % $P_2O_5$. Conventional photolithographic and RIE procedures, using $CHF_3$ as an etchant for BPSG, are next employed to open second contact hole openings 11, exposing the top surface of first contact plug structures 9. After removal of the photoresist shape used to define second contact holes 11, via plasma oxygen ashing and careful wet cleans, a conductive material, such as an in situ doped, polysilicon layer, or a tungsten layer, is deposited using LPCVD procedures, to a thickness between about 3000 to 8000 Angstroms, completely filling second contact holes 11. A selective RIE procedure, using $Cl_2$ as an etchant, or a CMP procedure, is used to remove regions of the conductive layer from the top surface of second BPSG layer 10, forming second contact plug structures 12, located in second contact holes 11, directly overlying, and contacting, first contact plug structures 9. This is schematically shown in FIG. 2. Silicon nitride layer 13, is next deposited, using LPCVD or PECVD procedures, to a thickness between about 100 to 1000 Angstroms, followed by the deposition of third BPSG layer 14, again using either LPCVD or PECVD procedures, at a thickness between about 5000 to 15000 Angstroms, again comprised with between about 15 to 25 weight % $B_2O_3$, and between about 5 to 10 weight % $P_2O_5$. The result of these depositions is schematically shown in FIG. 2.

Figure 3:
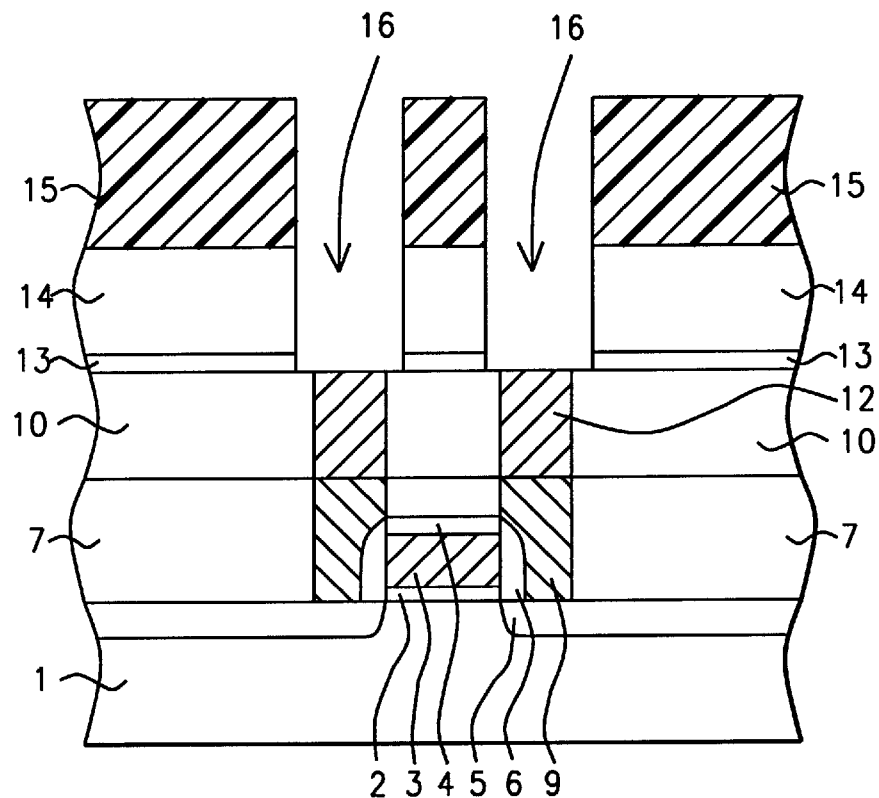
Figure 4:
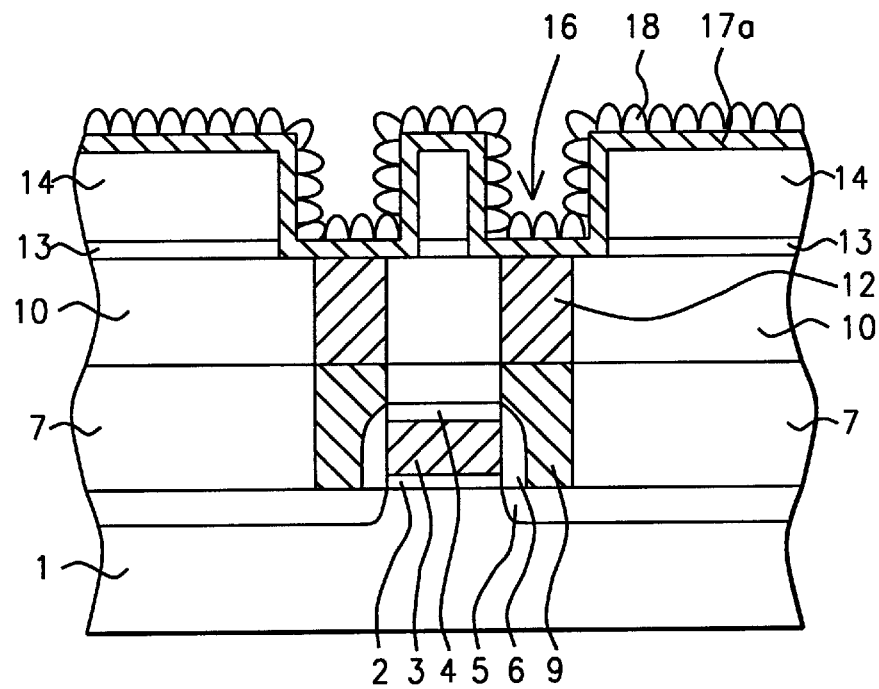

Photoresist shape 15, is used as a mask to allow an anisotropic RIE procedure, using $CHF_3$ as an etchant for third BPSG layer 14, and for silicon nitride layer 13, to create openings 16, exposing the top surface of second contact plug structures 12. This is schematically shown in FIG. 3. Openings 16, will be used to form subsequent crown shaped storage node structures. After removal of photoresist shape 15, via plasma oxygen ashing and careful wet cleans, polysilicon layer 17a, is deposited, via LPCVD procedures, to a thickness between about 300 to 800 Angstroms. Polysilicon layer 17a, located on the top surface of third BPSG layer 14, as well as coating the sides of openings 16, including overlying and contacting the top surface of second contact plug structures 12, is in situ doped, during deposition, via the addition of arsine or phosphine, to a silane ambient. To further increase the surface area of a storage node structure, in addition to the surface increases established via use of the crown shaped structure, a hemispherical grained silicon, (HSG), layer 18, comprised of convex and concave features, is formed on polysilicon layer 17a. This is schematically shown in FIG. 4. HSG layer 18, is obtained via deposition of an HSG silicon seed layer, at a temperature between about 450 to 650° C., to a thickness between about 100 to 500 Angstroms, followed by an anneal procedure, performed at a temperature between about 750 to 900°, in a nitrogen ambient, at a pressure between about 0.1 to 0.3 torr.

Figure 5:
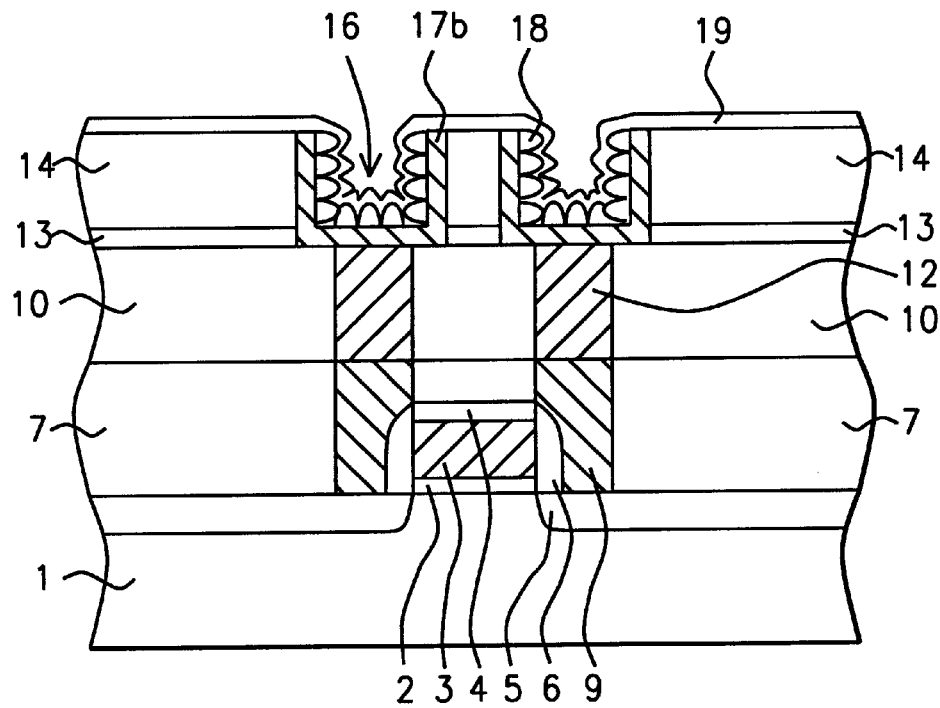
Figure 6:
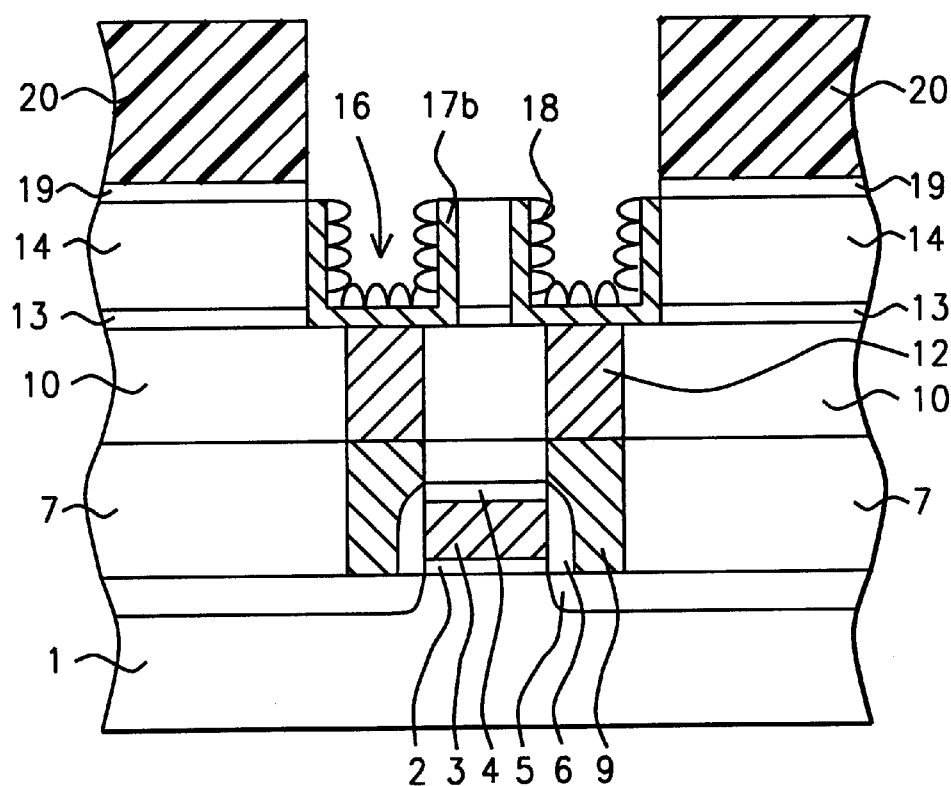

FIG. 5, shows the creation of individual crown shaped storage node structures, each in an opening 16. This is accomplished via a CMP procedure, removing the regions of both HSG silicon layer 18, as well as of polysilicon layer 17a, residing on the top surface of third BPSG layer 14, resulting in individual, crown shaped structures, comprised of HSG silicon layer 18, on underlying polysilicon shape 17b. A critical silicon oxide layer 19, obtained via LPCVD or PECVD procedures, at a thickness between about 100 to 1000 Angstroms, is next deposited, using tetraethylorthosilicate, (TEOS), as a source, overlying the individual, crown shaped storage node structures, as well as overlying the region of third BPSG layer 14, located between crown shaped storage node structures. In addition silicon oxide layer 19, overlays the top surface of third BPSG layer 14, in peripheral, or non-DRAM regions, of the semiconductor chip. This is schematically shown in FIG. 5.

Figure 7:
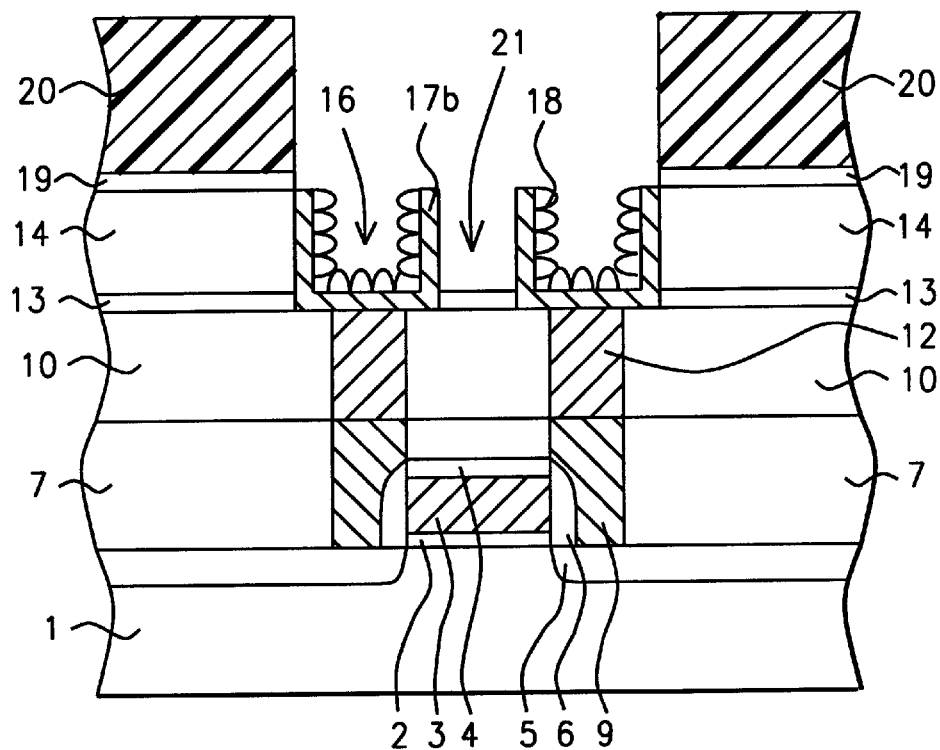

The selective removal of silicon oxide layer 19, in DRAM regions, is next addressed and schematically shown in FIG. 5. Photoresist shape 20, is formed on silicon oxide layer 19, in regions in which silicon oxide layer 19, resides in peripheral regions of the semiconductor chip, or in DRAM regions not occupied by the crown shaped storage node structures. A first vapor hydrofluoric, (HF), procedure, performed at a temperature between about 25 to 50° C., is then used to remove regions of silicon oxide, not covered by photoresist shape 20. This procedure is performed using between about 2 to 8 liters.min of vapor $H_2O$, in addition to between about 75 to 175 sccm of the HF vapor, resulting in the desired selectivity to the underlying BPSG layer, and is performed using a time mode procedure. Photoresist shape 20, subjected to the first vapor HF procedure, may be damaged as a result of exposure to the vapor HF procedure, and therefore may not supply the needed protection during a second vapor HF procedure, used to remove regions of third BPSG layer, from between the individual, crown shaped storage node structures, creating space 21. Therefore second vapor HF procedure, without the addition of vapor $H_2O$, is performed at a temperature between about 25 to 50° C., again using between about 75 to 175 sccm of vapor HF, to selectively remove third BPSG layer 14, without attacking silicon oxide layer 19, even for the case in which photoresist shape 20, were removed prior to the second vapor HF procedure. FIG. 7, schematically shows removal of third BPSG layer 14, in region 21, located between the individual crown shaped capacitor structures, with photoresist shape 20, in place, and used as an etch mask. However due to the selectivity, or etch rate ratio, of third BPSG layer 14, to silicon oxide layer 19, resulting from the use of only HF vapor, minus the vapor $H_2O$, this procedure can be performed without the masking photoresist shape 20, still resulting in removal of third BPSG layer 14, in regions between individual crown shaped storage node structures, while third BPSG layer 14, in the peripheral regions, and in DRAM regions not occupied by the crown shaped storage node structures, is protected by silicon oxide layer 19.

Figure 8:
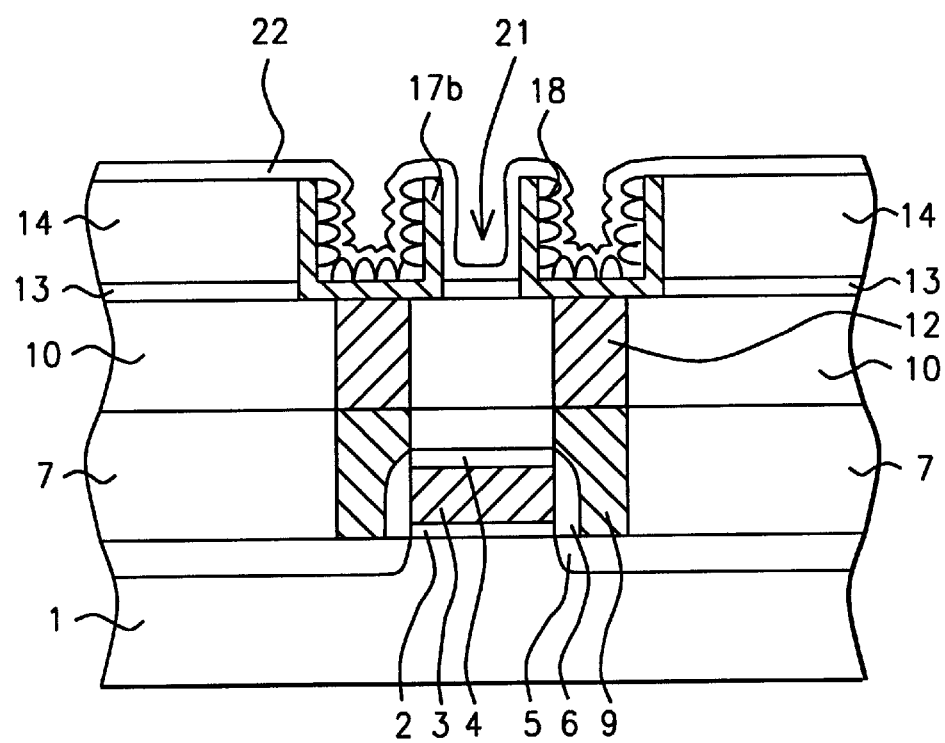
Figure 9:
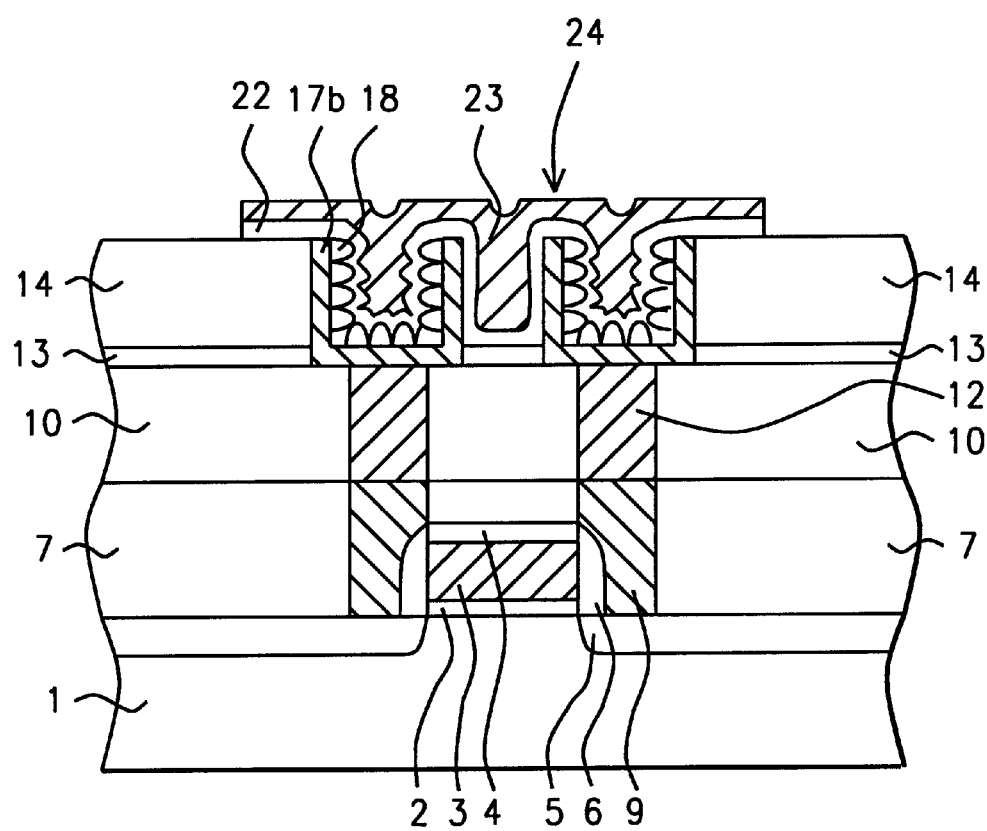

After removal of photoresist shape 20, via plasma oxygen ashing and careful wet cleans, the remaining regions of silicon oxide layer 19, located on the top surface of third BPSG layer 14, in the peripheral region, is removed via a wet HF procedure. This wet HF procedure is also used as a pre-clean for the formation of capacitor dielectric layer 22, formed on the crown shaped storage node structures. This is schematically shown in FIG. 8. Capacitor dielectric layer 22, is comprised of Oxidized silicon Nitride on silicon Oxide, (ONO). This is accomplished via initially forming a silicon oxide layer on the crown shaped storage node structures, to a thickness between about 50 to 100 Angstroms, via thermal oxidation procedures. A silicon nitride layer is next deposited, via LPCVD or PECVD procedures, to a thickness between about 30 to 100 Angstroms, than subjected to a thermal oxidation procedure, converting the silicon nitride layer to a silicon oxynitride layer, resulting in a capacitor dielectric layer, or ONO layer 22, at an equivalent silicon oxide thickness between about 50 to 100 Angstroms. A polysilicon layer is next deposited via LPCVD procedures, to a thickness between about 500 to 2000 Angstroms, either doped in situ, during deposition via the addition of arsine, or phosphine, to a silane ambient, or grown intrinsically then doped via ion implantation of arsenic, or phosphorous ions. The polysilicon layer also completely fills space 21, located between crown shaped storage node structures. Conventional photolithographic and RIE procedures, using $Cl_2$ as an etchant, are used to create upper polysilicon plate, or electrode 23, shown schematically in FIG. 9, resulting in a top surface topography, level with the top surface topography located in peripheral regions, or in DRAM regions not occupied by crown shaped storage node structures. Removal of the photoresist shape, used for definition of upper polysilicon plate 23, is accomplished via plasma oxygen ashing and careful wet cleans. Crown shaped capacitor structure 24, comprised of upper polysilicon plates, overlying several individual crown shaped storage node structures, can be used to fabricate sub micron, DRAM devices, with channel lenghts less than 0.25.

While this invention has been particularly shown and described with reference to the preferred embodiments thereof, it will be understood by those skilled in the art that various changes in form and details may be made without departing from the spirit or scope of this invention.

What is claimed is:

1. A method to obtain level top surface planarity for a semiconductor region, comprised with memory devices, featuring high step height features, and comprised with peripheral devices, featuring lower step height features, comprising the steps of:

providing transfer gate transistors, on a semiconductor substrate, with a source/drain region of a transfer gate transistor, located in a portion of said semiconductor substrate to be used for said memory devices;

providing contact hole openings, in insulator layers, exposing portions of the top surface of said source/drain region;

providing contact plug structures, formed in contact hole openings, contacting said source/drain region;

depositing a silicon nitride;

depositing a borophosphosilicate glass, (BPSG), layer;

forming openings in said BPSG layer, and in said silicon nitride layer, exposing the top surface of said contact plug structures;

forming crown shaped storage node structures in each opening, in said BPSG layer; and in said silicon nitride opening;

depositing a silicon oxide layer;

forming a photoresist shape, exposing the portion of said silicon oxide layer overlying said crown shaped storage node structures;

performing a first vapor hydrofluoric, (HF), procedure, to selectively remove said portion of said silicon oxide layer, exposed in said photoresist shape, from the top surface of said crown shaped storage node structures, and from the top surface of the region of said BPSG layer, located between said crown shaped storage node structures;

performing a second vapor HF procedure, to selectively remove the portion of said BPSG layer, from said silicon nitride layer, in a region located between said crown shaped storage node structures;

forming a capacitor dielectric layer on said crown shape storage node structures; and forming an upper plate structure, on said capacitor dielectric layer, with said upper plate structure filling the space between said crown shaped storage node structures, resulting in the formation of a crown shaped capacitor structure, in a memory device region, comprised of said upper plate structure, said capacitor dielectric layer, and said crown shaped storage node structures, with the top surfacel, in said memory device region, level with the top surface of peripheral regions, covered with said BPSG layer.

2. The method of claim 1, wherein said contact plug structures are comprised of either doped polysilicon, or tungsten.

3. The method of claim 1, wherein said silicon nitride layer is obtained via LPCVD or PECVD procedures, at a thickness between about 100 to 1000 Angstroms.

4. The method of claim 1, wherein said BPSG layer is obtained via LPCVD or PECVD procedures, at a thickness between about 5000 to 15000 Angstroms, comprised with between about 15 to 25 weight % $B_2O_3$, and between about 5 to 10 weight % $P_2O_5$.

5. The method of claim 1, wherein said openings are formed in said BPSG layer, and in said silicon nitride layer, via an anisotropic RIE procedure, using $CHF_3$ as an etchant for said BPSG layer, and as an etchant for said silicon nitride layer.

6. The method of claim 1, wherein said crown shaped storage node structures are comprised of an underlying polysilicon layer, obtained via LPCVD procedures, at a thickness between about 300 to 800 Angstroms, and doped in situ, during deposition, via the addition of arsine, or phosphine, to a silane ambient, and wherein said crown shaped storage node structures are also comprised of an overlying HSG silicon layer, obtained via deposition of an HSG silicon seed layer, at a temperature between about 450 to 650° C., to a thickness between about 100 to 500 Angstroms, then annealed at a temperature between about 750 to 900° C., in a nitrogen ambient, at a pressure between about 0.1 to 0.3 torr.

7. The method of claim 1, wherein said silicon oxide layer is obtained via LPCVD or PECVD procedures, to a thickness between about 100 to 1000 Angstroms, using TEOS as a source.

8. The method of claim 1, wherein said first vapor HF procedure, used to selectively remove said silicon oxide layer, from said BPSG layer, is performed at a temperature between about 25 to 50° C., using between about 75 to 175 sccm of HF vapor, with the addition of between about 2 to 8 liters/min of vapor $H_2O$.

9. The method of claim 1, wherein said second vapor HF procedure, used to selectively remove said BPSG layer, from the region between said crown shaped storage node structures, is performed at a temperature between about 25 to 50° C., using only between about 75 to 175 sccm of vapor HF.

10. The method of claim 1, wherein said upper plate structure is comprised of polysilicon, is obtained via LPCVD procedures, to a thickness between about 500 to 2000 Angstroms, either doped in situ, via the addition of arsine, or phosphine, to a silane ambient, or doped via ion implantation of arsenic, or phosphorous ions.

11. A method of using vapor HF procedures to obtain a level top surface planarity for a semiconductor region, comprised with DRAM devices, featuring high step height, crown shaped structures, and comprised with peripheral, logic devices, featuring lower step heights, comprising the steps of:

providing transfer gate transistors, on a region of said semiconductor substrate to be used for DRAM devices, with a source/drain region of a transfer gate transistor, located in a portion of said semiconductor substrate;

forming first contact plug structures, in first contact hole openings, in a first BPSG layer, with said first contact plug structures overlying, and contacting, a portion of the top surface of said source/drain region;

forming second contact plug structures, in second contact hole openings, in a second BPSG layer, with said second contact plug structures, overlying and contacting, said first contact plug structures;

depositing a silicon nitride layer;

depositing a third BPSG layer;

forming storage node openings in said third BPSG layer, and in said silicon nitride layer, exposing the top surface of said second contact plug structures;

depositing a first polysilicon layer;

forming an HSG silicon layer, on said first polysilicon layer;

performing a chemical mechanical polishing procedure, to form crown shaped storage node structures, in said storage node openings;

depositing a silicon oxide layer;

forming a photoresist shape, with an opening exposing a portion of said silicon oxide layer that overlays said crown shaped storage node structures, and with said opening exposing a portion of said silicon oxide layer that overlays a portion of said third BPSG layer, located between said crown shaped storage node structures;

performing a first vapor HF procedure, removing portions of said silicon oxide layer, exposed in said opening, in said photoresist shape;

performing a second vapor HF procedure, removing the portion of said third BPSG layer, located between said crown shaped storage node structures;

forming a capacitor dielectric layer, on said crown shaped storage node structures;

depositing a second polysilicon layer, filling the space between said crown shaped storage node structures; and patterning of said second polysilicon layer, to form a upper polysilicon plate, for a crown shaped capacitor structure, comprised of said upper polysilicon plate, comprised of said capacitor dielectric layer, and comprised of underlying, said crown shaped storage node structures, with the top surface of said crown shape capacitor structure, planar with the top surface of said third BPSG layer, located overlying said peripheral, logic devices.

12. The method of claim 11, wherein said first contact plug structures, and said second contact plug structures, are comprised of either doped polysilicon, or of tungsten.

13. The method of claim 11, wherein said silicon nitride layer is obtained via LPCVD or PECVD procedures, at a thickness between about 100 to 1000 Angstroms.

14. The method of claim 11, wherein said third BPSG layer is obtained via LPCVD or PECVD procedures, at a thickness between about 5000 to 15000 Angstroms, comprised with between about 15 to 25 weight % $B_2O_3$, and between about 5 to 10 weight % $P_2O_5$.

15. The method of claim 11, wherein said storage node openings are formed in said third BPSG layer, and in said silicon nitride layer, via an anisotropic RIE procedure, using $CHF_3$ as an etchant for said third BPSG layer, and as an etchant for said silicon nitride layer.

16. The method of claim 11, wherein said first polysilicon layer is obtained via LPCVD procedures, at a thickness between about 300 to 800 Angstroms, and doped in situ, during deposition, via the addition of arsine, or phosphine, to a silane ambient.

17. The method of claim 11, wherein said HSG silicon layer is obtained via deposition of a HSG silicon seed layer, at a temperature between about 450 to 650° C., to a thickness between about 100 to 500 Angstroms, then annealed at a temperature between about 750 to 900° C., at a pressure between about 01 to 0.3 torr, in a nitrogen ambient.

18. The method of claim 11, wherein said silicon oxide layer is obtained via LPCVD or PECVD procedures, to a thickness between about 100 to 1000 Angstroms, using TEOS as a source.

19. The method of claim 11, wherein said first vapor HF procedure, used to selectively remove said silicon oxide, is performed at a temperature between about 25 to 50° C., using between about 75 to 175 sccm of vapor HF, and with the addition of between about 2 to 8 liters/min of vapor $H_2O$.

20. The method of claim 11, wherein said second vapor HF procedure, used to selectively remove said third BPSG layer, is performed at a temperature between about 25 to 50° C., using only HF vapor, at a flow between about 75 to 175 sccm.

21. The method of claim 11, wherein said second polysilicon layer is obtained via LPCVD procedures, to a thickness between about 500 to 2000 Angstroms, and either doped in situ, during deposition, via the addition of arsine, or phosphine, to a silane ambient, or deposited intrinsically then doped via implantation of arsenic, or phosphorous ions.

* * * * *